US012681392B2

(12) United States Patent
Lee et al.

(10) Patent No.: US 12,681,392 B2
(45) Date of Patent: Jul. 14, 2026

(54) CYCLIC EXPOSURE SCANNING SYSTEM HAVING DISTRIBUTED MULTI-LENS AND METHOD THEREOF

(71) Applicant: National Cheng Kung University, Tainan (TW)

(72) Inventors: Yung-Chun Lee, Tainan (TW); Ting-Hsuan Miau, Tainan (TW); Chun-Ying Wu, Tainan (TW)

(73) Assignee: National Cheng Kung University, Tainan (TW)

( * ) Notice: Subject to any disclaimer, the term of this patent is extended or adjusted under 35 U.S.C. 154(b) by 159 days.

(21) Appl. No.: 18/619,278

(22) Filed: Mar. 28, 2024

(65) Prior Publication Data

US 2024/0329541 A1     Oct. 3, 2024

(30) Foreign Application Priority Data

Mar. 28, 2023     (TW) ................................... 112111786

(51) Int. Cl.
*G03F 7/20*          (2006.01)
*G03F 7/00*          (2006.01)

(52) U.S. Cl.
CPC .......... *G03F 7/704* (2013.01); *G03F 7/70391* (2013.01); *G03F 7/70558* (2013.01); *G03F 7/70725* (2013.01)

(58) Field of Classification Search
CPC .. G03F 7/704; G03F 7/70391; G03F 7/70558; G03F 7/70725; G03F 7/70275; G03F 7/70291; G03F 7/70358; G03F 7/70483
See application file for complete search history.

(56) References Cited

U.S. PATENT DOCUMENTS

2007/0216884 A1* 9/2007 Nagasaka .............. G03B 27/42
355/53

* cited by examiner

*Primary Examiner* — Mesfin T Asfaw
(74) *Attorney, Agent, or Firm* — Troutman Pepper Locke LLP; Tim Tingkang Xia, Esq.

(57) ABSTRACT

The present invention provides a cyclic exposure scanning system having distributed multi-lens and method thereof. The system includes a processor, a platform, an optical engine, a first optical imaging device, a second optical device and a light guide structure. By executing the method of the present disclosure by the system, the optical engine projects the first optical image and the second optical image respectively. The first optical image is guided to the first optical imaging device and the second optical image is sequentially guided to the second optical imaging device through the light guide structure. The first optical imaging device and the second optical imaging device receives and projects the first and second optical images onto the corresponding exposure areas, respectively. Such that efficiency and light source utilization may be significantly increased.

17 Claims, 9 Drawing Sheets

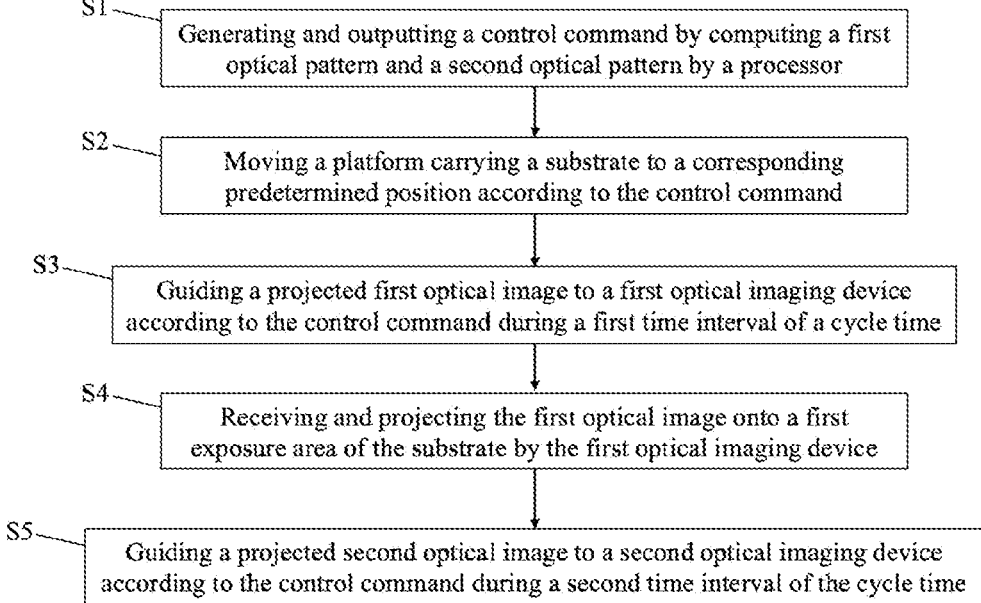

S1 — Generating and outputting a control command by computing a first optical pattern and a second optical pattern by a processor S2 — Moving a platform carrying a substrate to a corresponding predetermined position according to the control command S3 — Guiding a projected first optical image to a first optical imaging device according to the control command during a first time interval of a cycle time S4 — Receiving and projecting the first optical image onto a first exposure area of the substrate by the first optical imaging device S5 — Guiding a projected second optical image to a second optical imaging device according to the control command during a second time interval of the cycle time

FIG. 2

CYCLIC EXPOSURE SCANNING SYSTEM HAVING DISTRIBUTED MULTI-LENS AND METHOD THEREOF

CROSS REFERENCE

This non-provisional application claims benefit of Taiwan Patent Application No. 112111786 filed on Mar. 28, 2023. The contents thereof are incorporated by reference herein.

FIELD OF THE INVENTION

This invention relates to optical devices, in particular, to a cyclic exposure scanning system having distributed multi-lens and method thereof.

BACKGROUND OF THE INVENTION

Recently, optical lithography has gradually become the core of the electronic manufacturing industry. With increasing demand, in addition to exposure quality, exposure efficiency is crucial as well. In the past, to achieve higher exposure speed, the light was periodically flashing, with the light source being turned on within part of the cycle time and turned off for the rest. This method aimed to prevent elongation of projected light spots due to increased scanning speed. This approach may enhance exposure resolution and increase the exposure speed, but it may result in a low efficiency in light source utilization.

Therefore, the present invention provides a cyclic exposure scanning system having distributed multi-lens and the method thereof. A light guide structure is adopted to sequentially guide each optical image to the corresponding optical imaging device within the cycle time. This allows for the redirection of the light source to other optical imaging devices during the time when the light source would normally be turned off. It may effectively utilize the dark period of the flashing cyclic time of the light source, and it may improve the efficiency of maskless exposure processes and prevent waste of light source energy. Furthermore, it enables the simultaneous exposure of multiple substrates within one cycle time, thereby enhancing the exposure efficiency of the exposure machine and the utilization rate of the light source within one cycle time.

SUMMARY OF THE INVENTION

The present disclosure provides a cyclic exposure scanning system having distributed multi-lens. Through computational processing by the processor, the light guide structure can be gradually adjusted to sequentially guide the optical images projected by the optical engine to the corresponding optical imaging devices. Such that, the exposure processes of multiple exposure zones can be completed by using one single optical engine within a single cycle time, thereby reducing equipment costs.

The present disclosure provides a cyclic exposure scanning method having distributed multi-lens. Through computational processing by the processor, the optical images intended for exposure are synchronized with the corresponding output control commands within each cycle time. This enables the light guide structure to direct the optical images to the corresponding optical imaging devices according to the control commands. Therefore, the corresponding optical images are cyclically projected onto each exposure zone, thereby enhancing exposure efficiency.

In one embodiment of the present disclosure provides a cyclic exposure scanning system having distributed multi-lens including: a processor configured to perform computations according to a first optical pattern and a second optical pattern and output a corresponding control command; a platform configured to carry a substrate, wherein the platform moves according to the control command; an optical engine configured to project a corresponding first optical image and a corresponding second optical image according to the control command; a first optical imaging device configured to project the first optical image onto a first exposure area of the substrate; a second optical imaging device configured to project the second optical image onto a second exposure area of the substrate; and a light guide structure configured to guide the first optical image to the first optical imaging device and guide the second optical image to the second optical imaging device according to the control command.

Preferably, the platform includes a first sub-platform and a second sub-platform, the substrate includes a first sub-substrate and a second sub-substrate, the first sub-platform carries the first sub-substrate, the second sub-platform carries the second sub-substrate, the first sub-platform and the second sub-platform are moved respectively according to the control command.

Preferably, the optical engine includes a light source device and a digital micromirror array, the light source device emits light according to the control command, the digital micromirror array is configured to open and close multiple micromirrors according to the control command, the opened micromirrors project the first optical image and the second optical image based on the light.

Preferably, during a first time interval within a cycle time, the control command directs the optical engine to project the first optical image, the first image is guided by the light guiding structure to the first optical imaging device, the first optical imaging device receives and projects the first optical image onto the first exposure area, during a second time interval within the cycle time, the control command directs the optical engine to project the second optical image, the second image is guided by the light guiding structure to the second optical imaging device, the second optical imaging device receives and projects the second optical image onto the second exposure area.

Preferably, the first time interval and the second time interval account for 1% to 99% of the cycle time.

In another embodiment of the present disclosure provides a cyclic exposure scanning method having distributed multi-lens comprising: generating and outputting a control command by computing a first optical pattern and a second optical pattern by a processor; moving a platform carrying a substrate to a corresponding predetermined position according to the control command; guiding a projected first optical image to a first optical imaging device according to the control command during a first time interval of a cycle time; receiving and projecting the first optical image onto a first exposure area of the substrate by the first optical imaging device; guiding a projected second optical image to a second optical imaging device according to the control command during a second time interval of the cycle time; and receiving and projecting the second optical image onto a second exposure area of the substrate by the second optical imaging device.

Preferably, the platform includes a first sub-platform and a second sub-platform, the substrate comprises a first sub-substrate and a second sub-substrate, the first sub-platform carries the first sub-substrate, the second sub-platform carries the second sub-substrate, the first sub-platform is moved to a first corresponding predetermined position and the second sub-platform is moved to a second corresponding predetermined position according to the control command.

Preferably, the step of guiding a projected first optical image to a first optical imaging device according to the control command during a first time interval of a cycle time further includes: guiding the first optical image to the first optical imaging device through a light guide structure according to the control command, and receiving and projecting the first optical image onto a first exposure area by the first optical imaging device.

Preferably, the step of guiding a projected second optical image to a second optical imaging device according to the control command during a second time interval of a cycle time further includes: guiding the second optical image to the second optical imaging device through the light guide structure according to the control command, and receiving and projecting the second optical image onto a second exposure area by the second optical imaging device.

Preferably, the first time interval and the second time interval account for 1% to 99% of the cycle time.

The beneficial effect of this disclosure lies in the light guide structure is adjusted according to control commands within the cycle time, and the optical images are sequentially guided to each optical imaging device, facilitating cyclic exposure. Thereby the utilization of light source can be significantly increased.

BRIEF DESCRIPTION OF THE DRAWINGS

FIG. 2 is a flowchart illustrating the cyclic exposure scanning method having distributed multi-lens in one embodiment of the present disclosure.

DETAILED DESCRIPTION OF THE INVENTION

In order to make the aforementioned and/or other purposes, benefits, and features of the present disclosure clearer and more understandable, the following detailed description is provided, using preferred embodiments as examples.

Figure 1:
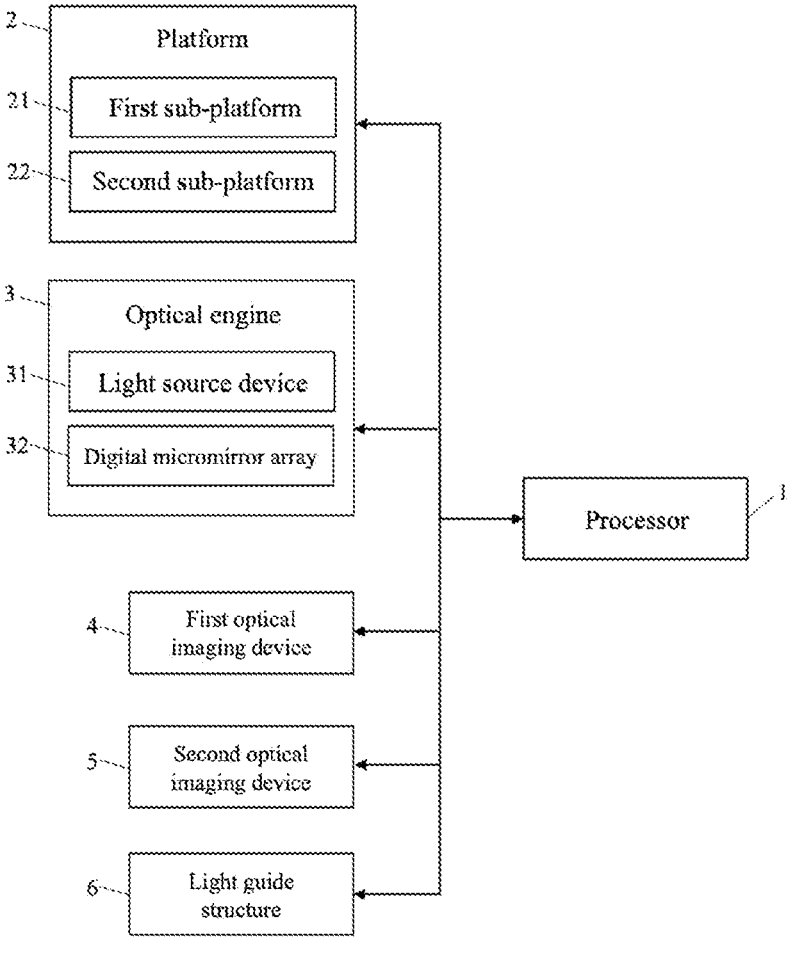
FIG. 1 is a schematic diagram illustrating the cyclic exposure scanning system having distributed multi-lens in one embodiment of the present disclosure.

Please refer to FIG. 1, FIG. 1 is a schematic diagram illustrating the cyclic exposure scanning system having distributed multi-lens in one embodiment of the present disclosure. The cyclic exposure scanning system of the present disclosure includes a processor 1, a platform 2, an optical engine 3, a first optical imaging device 4, a second optical imaging device 5 and a light guide structure 6. The detailed description is described in follow.

The processor 1 is electrically connected to the platform 2, the optical engine 3 and the light guide structure 6 respectively. The processor 1 performs computations based on a first optical pattern and a second optical pattern to generate corresponding control commands, which are sequentially outputted within a cycle time. It should be noted that the first optical pattern and the second optical pattern can be completely identical, partially identical, or entirely different.

The platform 2 carries the substrate Sb for the exposure process, where the quantity of substrates Sb is not limited thereto. In one embodiment, the platform 2 is moved to a corresponding predetermined position according to the control command. Preferably, the platform 2 moves toward the scanning axis at a constant speed from the predetermined position within the cycle time according to the control command.

In one embodiment, the platform 2 includes a first sub-platform 21 and a second sub-platform 22. The substrate Sb includes a first sub-substrate Sb1 and a second sub-substrate Sb2. The first sub-platform 21 carries the first sub-substrate Sb1, while the second sub-platform 22 carries the second sub-substrate Sb2. The first sub-platform 21 can be moved to a first predetermined position according to the control command, and the second sub-platform 22 can be moved to a second predetermined position according to the control command. In one embodiment, the first sub-platform 21 and the second sub-platform 22 move to the corresponding positions along the corresponding predetermined paths, allowing the first sub-substrate Sb1 and the second sub-substrate Sb2 to be exposed by different optical patterns. But the present disclosure is not limited thereto. The first sub-platform 21 and the second sub-platform 22 may have different predetermined positions, and the first sub-platform 21 and the second sub-platform 22 can scan and move at constant speeds differently from their predetermined positions toward the scanning axis.

The optical engine 3 includes a light source device 31 and a digital micromirror array 32. The optical engine 3 is positioned on one side relative to the substrate Sb, and the light source device 31 and the digital micromirror array 32 are arranged opposite to each other. That is, the light source device 31 and the digital micromirror array 32 are optically connected, allowing the digital micromirror array 32 to receive the light emitted by the light source device 31. In one embodiment, the light source may be ultraviolet (UV), but the present disclosure is not limited thereto.

The digital micromirror array 32 is an array composed of multiple micromirrors. The individual micromirror within the digital micromirror array 32 can be opened or closed according to the control command. When the light source device 31 emits the light to the digital micromirror array 32, the opened micromirrors project the first optical image and the second optical image based on the light source. The first and second optical images consist of an array of multiple light spots.

The first optical imaging device 4 is positioned on one side of the light guide structure 6, thereby forming an optical connection between the first optical imaging device 4 and the light guide structure 6. The first optical imaging device 4 is configured to receive the first optical image and project the first optical image onto a first exposure area E1 of the substrate Sb.

The second optical imaging device 5 is positioned on one side of the light guide structure 6, thereby forming an optical connection between the second optical imaging device 5 and the light guide structure 6. The second optical imaging device 5 is configured to receive the second optical image and project the second optical image onto a second exposure area E2 of the substrate Sb.

In one embodiment, the numbers of the first optical imaging device 4 and the second optical imaging device 5 are not limited. They can be arranged according to the required number of exposure areas. Multiple substrates Sb can be simultaneously placed on the platform 2, each with at least one exposure area. Alternatively, a single substrate Sb can have multiple exposure areas.

In one embodiment, the first optical image and the second optical image can be completely identical, partially identical, or entirely different.

The light guide structure 6 is positioned on one side of the digital micromirror array 32 and is configured to guide the first optical image and the second optical image to the corresponding optical imaging devices. In one embodiment, the light guide structure 6 is selected from commonly used optical components in laser optics, such as vibrating mirrors or reflective mirrors with a rotating structure, or other structures capable of guiding light. But the present disclosure is not limited thereto, as long as it can change the projection angle of the optical images, it is included in the present disclosure.

In one embodiment, during the first time interval within the cycle time, the optical engine 3 projects the first optical image according to the control command. Simultaneously, the light guide structure 6 guides the first optical image to the first optical imaging device 4 according to the control command, allowing the first optical imaging device 4 to receive and project the first optical image onto the first exposure area E1.

In one embodiment, during the second time interval within the cycle time, the optical engine 3 projects the second optical image according to the control command. Simultaneously, the light guide structure 6 guides the second optical image to the second optical imaging device 5 according to the control command, allowing the second optical imaging device 5 to receive and project the second optical image onto the second exposure area E2.

In other words, within one cycle period, there is a portion of time is allocated to project the first optical image onto the first exposure area E1, while another portion of time is allocated to project the second optical image onto the second exposure area E2. If there are more exposure areas, the corresponding optical images can be projected from the corresponding optical imaging devices within one cycle time. After one cycle time ends, a new round of exposure procedure is initiated until the optical patterns are completely exposed on the substrate Sb.

In one embodiment, the optical engine 3 emits light onto the first sub-substrate Sb1 and the second sub-substrate Sb2 during the first and second times of the cycle period, respectively. The first and second time interval account for 1% to 99% of the cycle time, which represents the duty cycle. For example, if the ratio is 10% and the cycle time is 1 ms, the first and second time interval would be 0.1 ms each. During this time, the light source device 31 emits light, which is considered to be the "bright zone" of the flashing cycle of the light source device 31. The rest of the time is considered to be the "dark zone" of the flashing cycle of the light source device 31. In the "dark zone," the light source device 31 can choose to either to turn off the light source or continue emitting light. Since the light guide structure 6 may direct the projected optical image to the position where there is no substrates Sb located on, continuously emitting light during the "dark zone" may not affect the process, but the present disclosure is not limited thereto.

In one embodiment, in the practical implementation of the system, the light source device 31 projects ultraviolet light to the digital micromirror array 32 and generates a patterned ultraviolet light. This patterned ultraviolet light is then sequentially directed into various sets of optical imaging devices through the mirrors having rotating structures. By rotating the mirrors through the rotating structure, the ultraviolet light exposure can be performed on photoresist layers (PR) arranged at different positions in a cyclic manner. Consequently, the 360-degree rotating mirror may achieve the effect of "periodic flashing of light source" without wasting light energy. When the images are generated on the photoresist layer, the scanning exposure begins. While maintaining exposure pattern resolution and scanning speed, multiple exposures can be performed simultaneously. This system may increase the efficiency of ultraviolet light utilization or, equivalently, increase the throughput of maskless exposure, and the construction cost of the optical engine 3 may be reduced.

To clearly explain of the embodiment of the present disclosure, please refer to FIG. 2, FIG. 2 is a flowchart illustrating the cyclic exposure scanning method having distributed multi-lens in one embodiment of the present disclosure. The method includes the following steps.

In step S1, generating and outputting a control command by computing a first optical pattern and a second optical pattern by a processor.

In step S2, moving a platform carrying a substrate to a corresponding predetermined position according to the control command.

In step S3, guiding a projected first optical image to a first optical imaging device according to the control command during a first time interval of a cycle time.

In step S4, receiving and projecting the first optical image onto a first exposure area of the substrate by the first optical imaging device.

In step S5, guiding a projected second optical image to a second optical imaging device according to the control command during a second time interval of the cycle time.

In step S6, receiving and projecting the second optical image onto a second exposure area of the substrate by the second optical imaging device.

As described in step S1, the first optical pattern and second optical pattern, which are desire to be exposed, are inputted into the processor 1, allowing the processor 1 to compute and generate corresponding control commands.

As described in step S2, the platform 2 moves to the corresponding predetermined position according to the control command. In one embodiment, based on the control commands, the first sub-platform 21 of the platform 2 carries the first sub-substrate Sb1 and moves to the first corresponding predetermined position, and the second sub-platform 22 of the platform 2 carries the second sub-substrate Sb2 and moves to the second corresponding predetermined position. The first sub-platform 21 and the second sub-platform 22 move along the predetermined paths and speeds, respectively, but the present disclosure is not limited thereto.

In one embodiment, when there is only one platform 2, it can undergo a constant scanning speed at the predetermined positions, with consistent paths and scanning speeds in each exposure area. When there are multiple platforms 2, the predetermined positions, subsequent paths and speed can be adjusted according to individual requirements, but the present disclosure is not limited thereto.

As described in step S3, in the first time interval within the cycle time, the optical engine 3 projects the first optical image to the light guide structure 6 according to the control command. The light guide structure 6 then direct the first optical image to the first optical imaging device 4. In one embodiment, when the light guide structure 6 is a mirror, it can be rotated toward the first optical imaging device 4 according to the control command. However, the present disclosure is not limited thereto, as long as it can guide the first optical image to the first optical imaging device 4, it is included in the present disclosure.

As described in step S4, the first optical imaging device 4 projects the received first optical image onto the first exposure area E1 of the substrate Sb. In one embodiment, the first exposure area E1 can be located on the first sub-substrate Sb1, but the present disclosure is not limited thereto.

As described in step S5, in the second time interval within the cycle time, the optical engine 3 projects the second optical image to the light guide structure 6 according to the control command. The light guide structure 6 then direct the second optical image to the second optical imaging device 5. In one embodiment, when the light guide structure 6 is a mirror, it can be rotated toward the second optical imaging device 5 according to the control command. However, the present disclosure is not limited thereto, as long as it can guide the second optical image to the second optical imaging device 5, it is included in the present disclosure.

As described in step S6, the second optical imaging device 5 projects the received second optical image onto the second exposure area E2 of the substrate Sb. In one embodiment, the second exposure area E2 can be located on the second sub-substrate Sb2, but the present disclosure is not limited thereto.

To clearly explain of the embodiment of the present disclosure, the detail description is described as follow.

Figure 3:
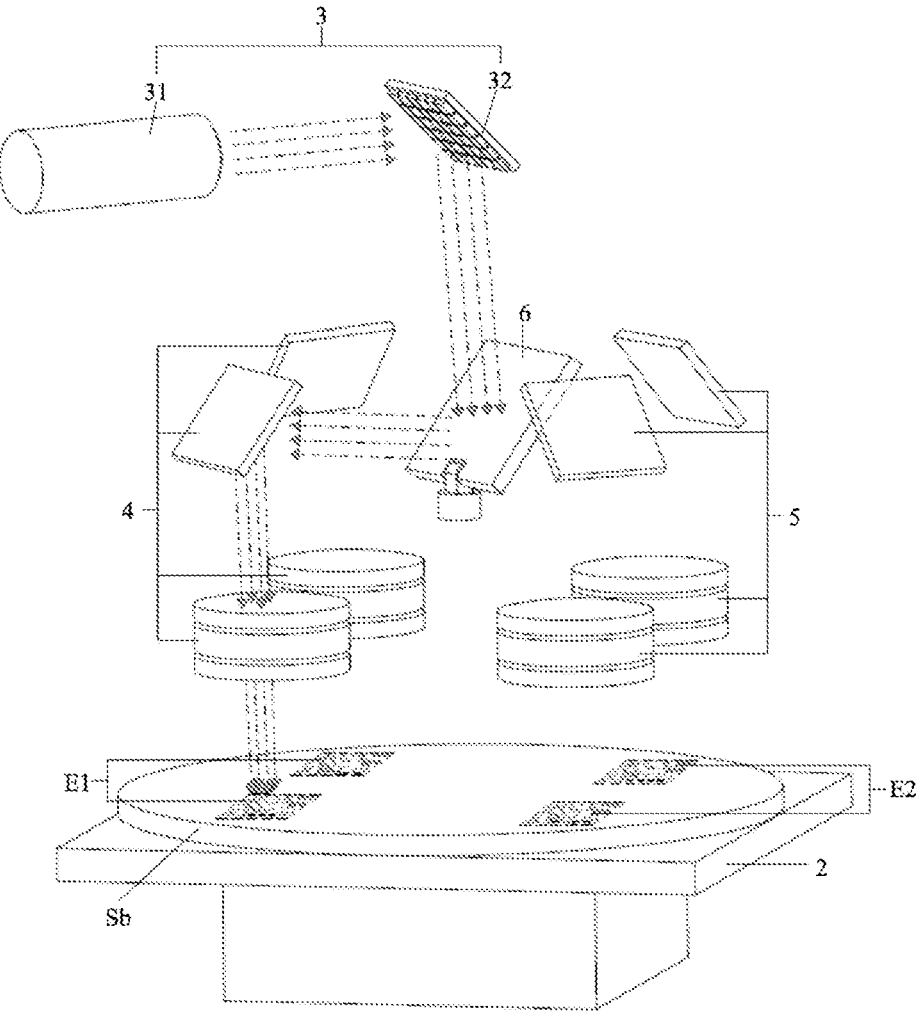
FIG. 3 is a schematic diagram illustrating the cyclic exposure scanning system having distributed multi-lens in one embodiment of the present disclosure.

Please refer to FIG. 3, FIG. 3 is a schematic diagram illustrating the cyclic exposure scanning system having distributed multi-lens in one embodiment of the present disclosure. As shown in FIG. 3, in one embodiment, one single substrate Sb is placed on the platform 2, and the substrate Sb has the first exposure area E1 and the second exposure area E2. For example, the first exposure area E1 and the second exposure area E2 has two exposure areas, respectively. The first exposure area E1 corresponds to the first optical imaging device 4, while the second exposure area E2 corresponds to the second optical imaging device 5. In this embodiment, if there are four exposure areas as shown in FIG. 3, four optical imaging devices are adopted. The optical patterns to be exposed onto the four exposure areas can be completely identical, partially identical, or completely different.

When the processor 1 receives the optical pattern to be exposed, it performs computations regarding the optical pattern to generate control commands. The platform 2, the optical engine 3 and the light guide structure 6 are activated according to the control commands. Taking the cycle time of 1 ms as an example, if the optical engine 3 projects the optical image onto the substrate Sb in a time ratio of 10% in each cycle time, which is 0.1 ms. In this embodiment, with four exposure areas, the light guide structure 6 can sequentially guide the optical image to each optical imaging device. The light source device 31 can choose to emit light only during the period when the optical images are projecting, in this example, emitting light for 0.1 ms to form the optical image. The light is not emitted for the rest of the time, or, in another example, the light can be emitted continuously.

In this example, on the one hand, it can avoid the problem of the exposure resolution declined due to the movement of the platform 2 while the light source device 31 turns on for a long period of time. On the other hand, the time that the light source needs to be turned off originally in one cycle time can be fully utilized. For example, originally, with a single cycle time of 1 ms, the light is emitted only for 0.1 ms, and the light requires turning off for the remaining 0.9 ms. However, in this embodiment, under the same cycle time, the light is cyclically emitted for 0.1 ms each time when the optical image is projected onto the substrate Sb to sequentially expose the four exposure areas. That is, in one cycle time, only 0.6 ms is the light source not to be utilized. This not only increases the utilization rate of the light source but also achieves the exposure efficiency of one single optical engine 3 within one cycle time, while maintaining exposure accuracy.

Figure 4:
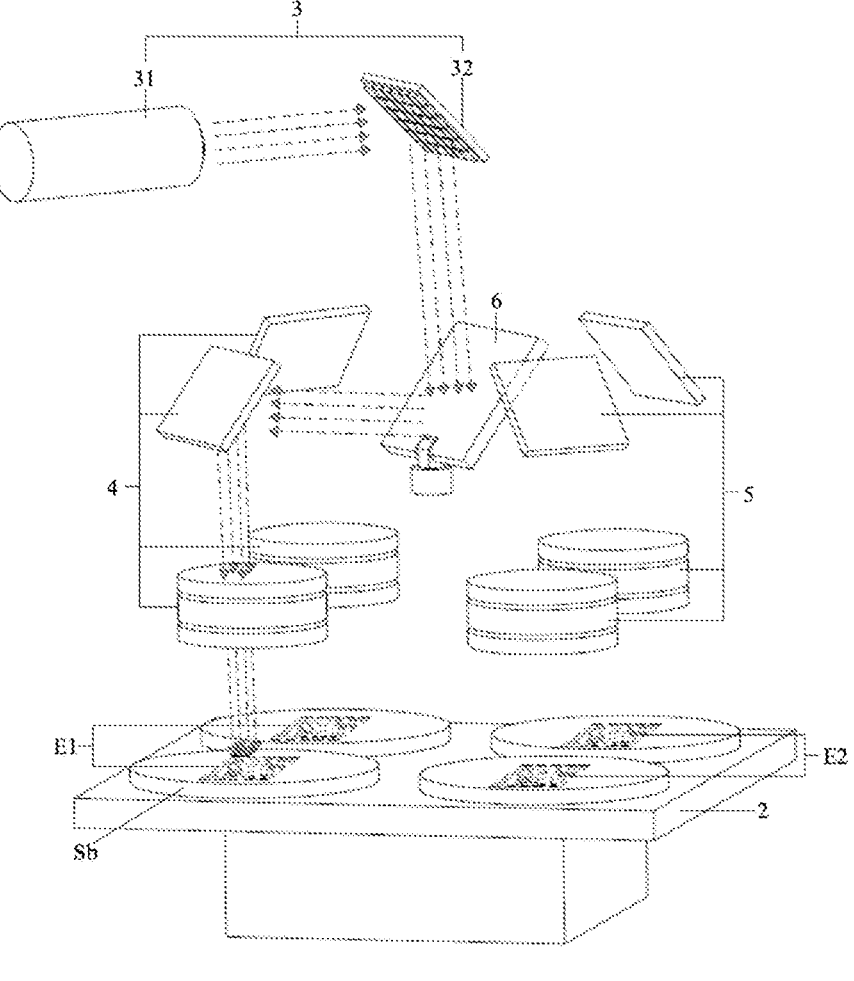
FIG. 4 is a schematic diagram illustrating the cyclic exposure scanning system having distributed multi-lens in another embodiment of the present disclosure.
Figure 5:
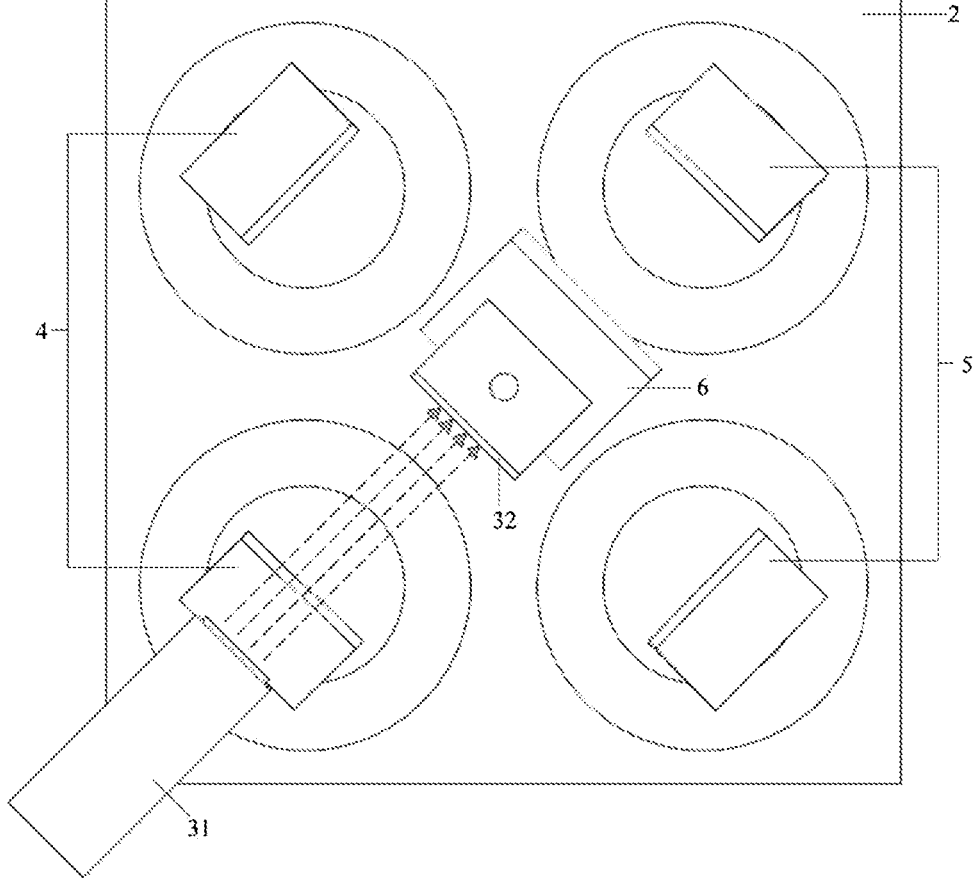
FIG. 5 is a top view of the cyclic exposure scanning system having distributed multi-lens in another embodiment of the present disclosure.

Please refer to FIG. 4 and FIG. 5, FIG. 4 is a schematic diagram and FIG. 5 is a top view of the cyclic exposure scanning system having distributed multi-lens in another embodiment of the present disclosure. As shown in the figures, in one embodiment, four substrates Sb are placed on the platform 2, with each substrate Sb having one exposure area. Therefore, with four substrates Sb, there are four exposure areas. Similarly, one optical imaging device is provided for each exposure area. In this embodiment, four optical imaging devices are adopted for the four exposure areas. The optical patterns to be exposed in the four exposure areas can be completely identical, partially identical, or completely different.

The difference between this embodiment and the previous embodiment lies in the number of the substrate on the platform 2. In this embodiment, four substrates Sb are carried, with each substrate Sb having one exposure area. The operations of the platform 2, the optical engine 3, and the light guide structure 6 are the same as in the previous embodiment, so it will not be further elaborated here.

Figure 6:
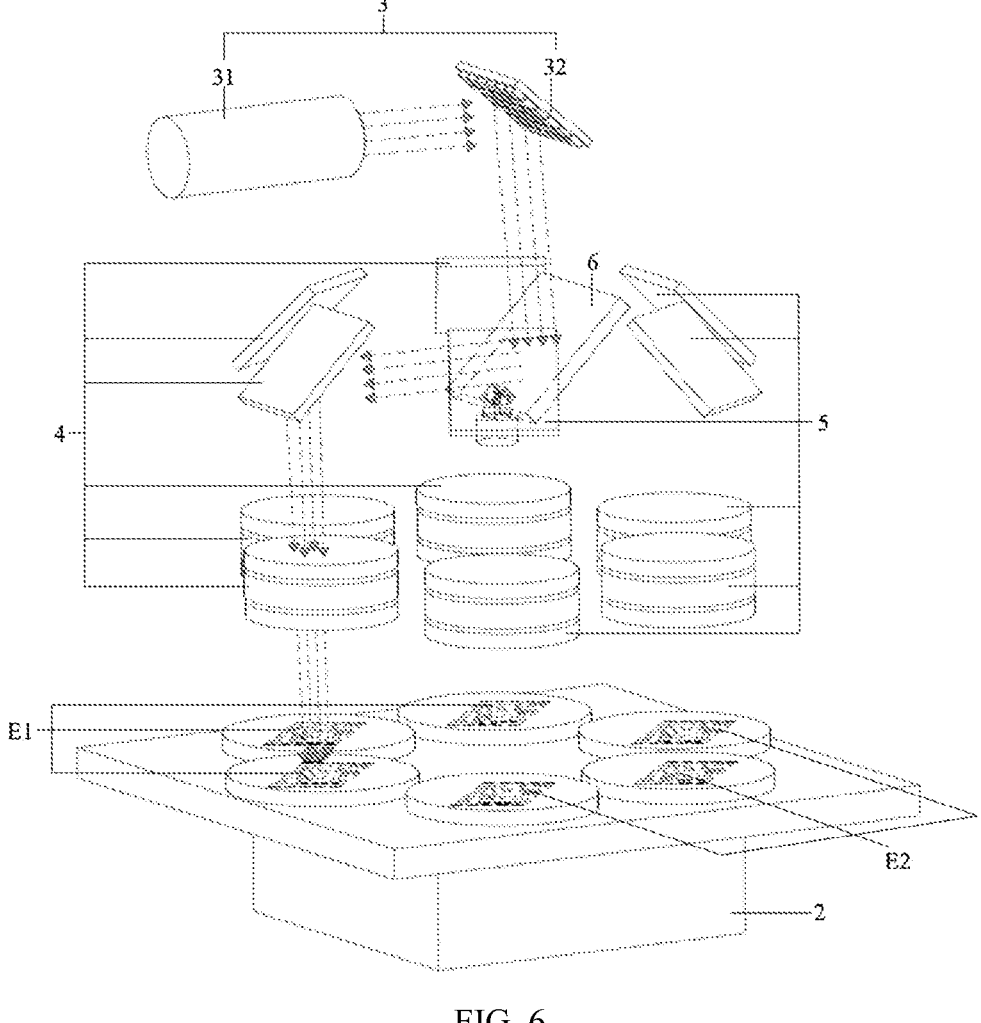
FIG. 6 is a schematic diagram illustrating the cyclic exposure scanning system having distributed multi-lens in another embodiment of the present disclosure.
Figure 7:
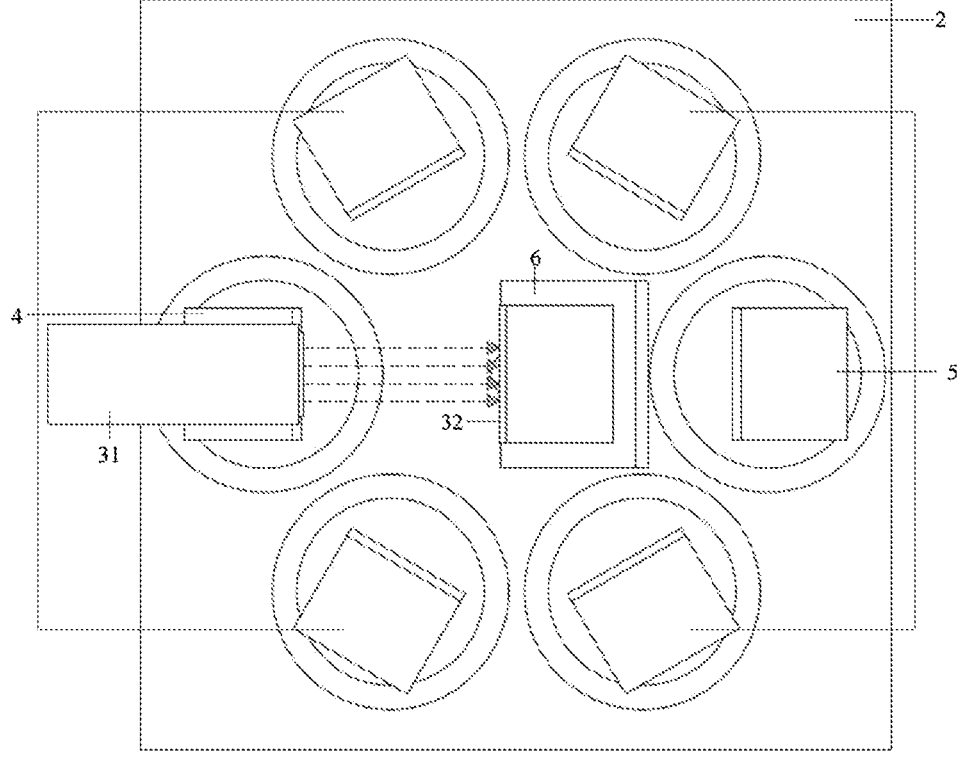
FIG. 7 is a top view of the cyclic exposure scanning system having distributed multi-lens in another embodiment of the present disclosure.

Please refer to FIG. 6 and FIG. 7, FIG. 6 is a schematic diagram and FIG. 7 is a top view of the cyclic exposure scanning system having distributed multi-lens in another embodiment of the present disclosure. As shown in the figures, in one embodiment, six substrates Sb are placed on the platform 2, with each substrate Sb having one exposure area. Therefore, with six substrates Sb, there are six exposure areas. Similarly, one optical imaging device is provided for each exposure area. In this embodiment, six optical imaging devices are adopted for the six exposure areas. The optical patterns to be exposed in the six exposure areas can be completely identical, partially identical, or completely different.

The difference between this embodiment and the second embodiment lies in the number of substrates and exposure areas on the platform 2. In this embodiment, six substrates Sb are carried, with each substrate Sb having one exposure area. The operation of the platform 2, the optical engine 3, and the light guide structure 6 is the same as in the previous embodiment, so it will not be further elaborated here. In this embodiment, within one cycle time, the light source is emitted for 0.1 ms to form optical images in each exposure area, meaning only 0.4 ms of the light source within the single cycle time is not utilized, resulting in a higher light source utilization rate compared to the second embodiment.

Figure 8:
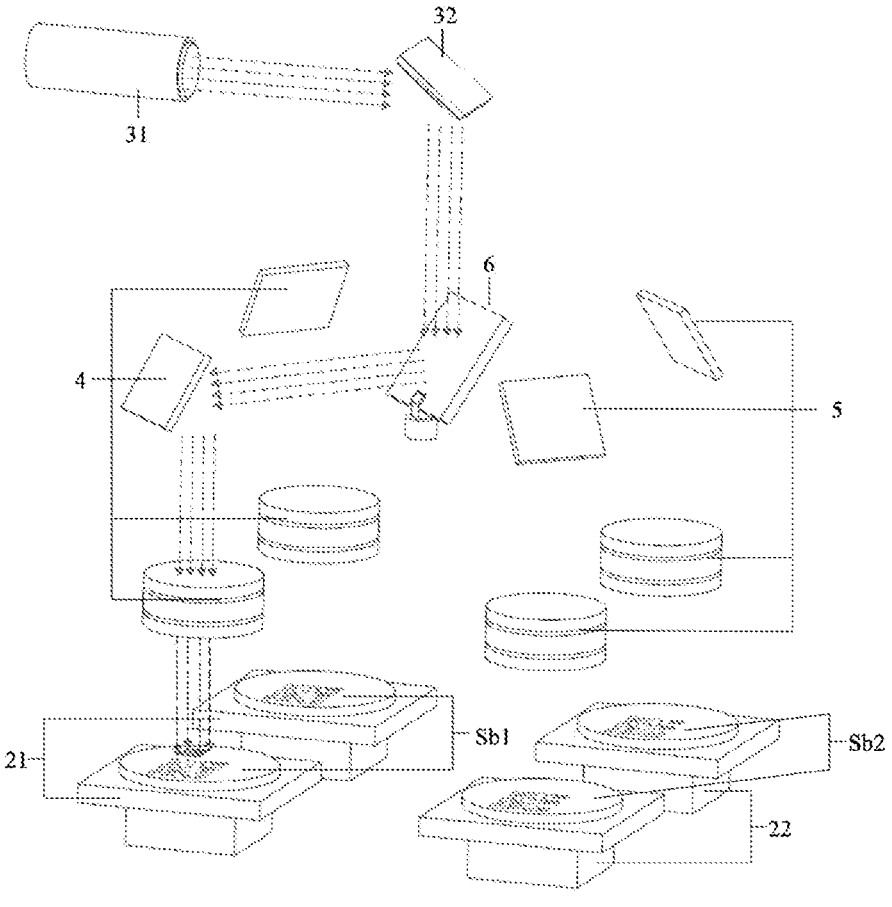
FIG. 8 is a schematic diagram illustrating the cyclic exposure scanning system having distributed multi-lens in another embodiment of the present disclosure.
Figure 9:
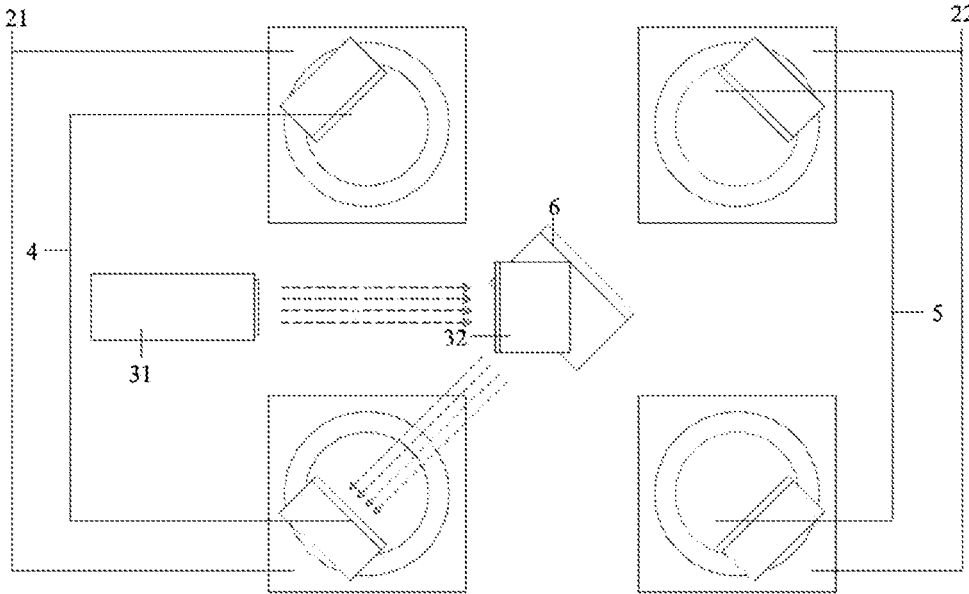
FIG. 9 is a top view of the cyclic exposure scanning system having distributed multi-lens in another embodiment of the present disclosure.

Please refer to FIG. 8 and FIG. 9, FIG. 8 is a schematic diagram and FIG. 9 is a top view of the cyclic exposure scanning system having distributed multi-lens in another embodiment of the present disclosure. As shown in the Figures, in this embodiment, the system includes four sub-carriers, each with one sub-substrate, and each sub-substrate has an exposure area. Thus, there are four exposure areas for the four sub-substrates. Similarly, one optical imaging device is configured with respect to one exposure area. For example, in this embodiment, four optical imaging devices are adopted for four exposure areas. The optical patterns to be exposed in each of the four exposure areas can be completely identical, partially identical, or entirely different. Additionally, each sub-carrier can be moved according to different paths and speeds.

In one embodiment of the present disclosure, multiple substrates may be cyclically exposed within one cycle time using only one optical engine 3 to project the optical images. Additionally, the light guide structure 6 is added to guide the optical images to the corresponding optical imaging devices. The number of optical imaging device is not limited hereto and can be increased based on the number of exposure area, such that the waste of the light energy caused by the flashing of the light source can be avoided, and the efficiency and throughput of maskless exposure can be increased by a factor of N, where N is the number of optical imaging device. This approach achieves a significant increase in light source utilization rate without substantially increasing equipment costs or compromising exposure accuracy.

In summary, the present disclosure provides cyclic exposure scanning system having distributed multi-lens and method thereof. By adopting at least two or more optical imaging devices and adjusting the light guide structure, the optical images are sequentially directed to each optical imaging device. This enables scanning of multiple exposure areas with arrays of light spots, such that the light source utilization rate can be significantly increased.

The above description represents only preferred embodiments of the present invention, and the scope of the present invention should not be limited to these embodiments. Therefore, any simple equivalent changes and modifications made according to the scope of the patent claims and the content of the invention disclosure are still within the scope of the present invention.

What is claimed is:

1. A cyclic exposure scanning system having distributed multi-lens comprising:

a processor configured to perform computations according to a first optical pattern and a second optical pattern and output a corresponding control command;

a platform configured to carry a substrate, wherein the platform moves according to the control command;

an optical engine configured to project a corresponding first optical image and a corresponding second optical image according to the control command;

a first optical imaging device configured to project the first optical image onto a first exposure area of the substrate;

a second optical imaging device configured to project the second optical image onto a second exposure area of the substrate; and a light guide structure configured to guide the first optical image to the first optical imaging device and guide the second optical image to the second optical imaging device according to the control command;

wherein during a first time interval within a cycle time, the control command directs the optical engine to project the first optical image, the first image is guided by the light guiding structure to the first optical imaging device, the first optical imaging device receives and projects the first optical image onto the first exposure area, during a second time interval within the cycle time, the control command directs the optical engine to project the second optical image, the second image is guided by the light guiding structure to the second optical imaging device, the second optical imaging device receives and projects the second optical image onto the second exposure area.

2. The cyclic exposure scanning system having distributed multi-lens of claim 1, wherein the platform comprises a first sub-platform and a second sub-platform, the substrate comprises a first sub-substrate and a second sub-substrate, the first sub-platform carries the first sub-substrate, the second sub-platform carries the second sub-substrate, the first sub-platform and the second sub-platform are moved respectively according to the control command.

3. The cyclic exposure scanning system having distributed multi-lens of claim 2, wherein the first sub-platform and the second sub-platform move to corresponding positions along corresponding predetermined paths, respectively.

4. The cyclic exposure scanning system having distributed multi-lens of claim 3, wherein the first sub-platform and the second sub-platform move at constant speeds differently from the predetermined positions toward a scanning axis.

5. The cyclic exposure scanning system having distributed multi-lens of claim 4, wherein the first time interval and the second time interval account for 1% to 99% of the cycle time.

6. The cyclic exposure scanning system having distributed multi-lens of claim 1, wherein the first optical pattern and the second optical pattern are completely identical, partially identical, or entirely different.

7. The cyclic exposure scanning system having distributed multi-lens of claim 1, wherein the optical engine comprises a light source device and a digital micromirror array, the light source device emits light according to the control command, the digital micromirror array is configured to open and close multiple micromirrors according to the control command, the opened micromirrors project the first optical image and the second optical image based on the light.

8. The cyclic exposure scanning system having distributed multi-lens of claim 1, wherein the first optical image and the second optical image are completely identical, partially identical, or entirely different.

9. The cyclic exposure scanning system having distributed multi-lens of claim 1, wherein the light guide structure has a rotating structure configured to rotate the light guide structure toward the first optical imaging device and the second optical imaging device according to the control commands.

10. A cyclic exposure scanning method having distributed multi-lens comprising:

generating and outputting a control command by computing a first optical pattern and a second optical pattern by a processor;

moving a platform carrying a substrate to a corresponding predetermined position according to the control command;

guiding a projected first optical image to a first optical imaging device through a light guide structure according to the control command during a first time interval of a cycle time;

receiving and projecting the first optical image onto a first exposure area of the substrate by the first optical imaging device;

guiding a projected second optical image to a second optical imaging device through the light guide structure according to the control command during a second time interval of the cycle time; and receiving and projecting the second optical image onto a second exposure area of the substrate by the second optical imaging device.

11. The cyclic exposure scanning method having distributed multi-lens of claim 10, wherein the platform comprises a first sub-platform and a second sub-platform, the substrate comprises a first sub-substrate and a second sub-substrate, the first sub-platform carries the first sub-substrate, the second sub-platform carries the second sub-substrate, the first sub-platform is moved to a first corresponding predetermined position and the second sub-platform is moved to a second corresponding predetermined position according to the control command.

12. The cyclic exposure scanning method having distributed multi-lens of claim 11, wherein the first sub-platform and the second sub-platform are moved to corresponding positions along corresponding predetermined paths, respectively, according to the control command.

13. The cyclic exposure scanning method having distributed multi-lens of claim 12, wherein the first sub-platform and the second sub-platform are moved at constant speeds differently from the predetermined positions toward a scanning axis.

14. The cyclic exposure scanning method having distributed multi-lens of claim 10, wherein the first optical pattern and the second optical pattern are completely identical, partially identical, or entirely different.

15. The cyclic exposure scanning method having distributed multi-lens of claim 10, wherein the first optical image and the second optical image are completely identical, partially identical, or entirely different.

16. The cyclic exposure scanning method having distributed multi-lens of claim 10, wherein the method further comprises:

rotating the light guide structure toward the first optical imaging device and the second optical imaging device through a rotating structure according to the control command.

17. The cyclic exposure scanning method having distributed multi-lens of claim 11, wherein the first time interval and the second time interval account for 1% to 99% of the cycle time.

* * * * *